United States Patent
Giraud et al.

(10) Patent No.: US 7,557,650 B2
(45) Date of Patent: Jul. 7, 2009

(54) ELECTRONIC SIGNAL GENERATOR WITH MODULATED CYCLIC RATIO, COMPENSATED FOR VARIATIONS IN ITS POWER SUPPLY VOLTAGE

(75) Inventors: Olivier Giraud, Villard de Lans (FR); Roger Petigny, Saint-Martin D'Uriage (FR); Philippe Marguery, Poisat (FR)

(73) Assignee: STMicroelectronics S.A., Montrouge (FR)

( * ) Notice: Subject to any disclaimer, the term of this patent is extended or adjusted under 35 U.S.C. 154(b) by 201 days.

(21) Appl. No.: 11/716,536

(22) Filed: Mar. 9, 2007

(65) Prior Publication Data

US 2007/0262815 A1    Nov. 15, 2007

(30) Foreign Application Priority Data

Mar. 13, 2006  (FR) .................................. 06 02189

(51) Int. Cl.
*H03F 3/38* (2006.01)
(52) U.S. Cl. ..................... 330/10; 330/251; 330/207 A; 330/9
(58) Field of Classification Search .................. 330/10, 330/251, 207 A, 9
See application file for complete search history.

(56) References Cited

U.S. PATENT DOCUMENTS

| | | | | |
|---|---|---|---|---|
| 4,554,512 | A | | 11/1985 | Aiello |
| 4,912,423 | A | * | 3/1990 | Milkovic et al. ................ 330/9 |
| 5,247,581 | A | * | 9/1993 | Gurcan ....................... 381/321 |
| 6,493,404 | B1 | * | 12/2002 | Iizuka et al. ................. 375/343 |
| 6,707,337 | B2 | * | 3/2004 | Noro ............................ 330/10 |
| 7,339,425 | B2 | * | 3/2008 | Yang et al. ..................... 330/10 |
| 2005/0017799 | A1 | | 1/2005 | Risbo et al. |

FOREIGN PATENT DOCUMENTS

| | | |
|---|---|---|
| EP | 0 817 371 A1 | 1/1998 |
| EP | 1 003 279 A2 | 5/2000 |

OTHER PUBLICATIONS

Preliminary French Search Report, FR 06 02189, dated Nov. 2006.

* cited by examiner

*Primary Examiner*—Patricia Nguyen
(74) *Attorney, Agent, or Firm*—Gardere Wynne Sewell LLP

(57) ABSTRACT

A generator capable of supplying one or more output signals with a modulated cyclic ratio includes one or more formatting circuits each processing one input signal and one or more class D amplifiers powered with a power supply voltage and being driven by a corresponding one of the formatting circuits. Each formatting circuit has a counter-reaction loop and uses a reference voltage for which the average value is equal to half the power supply voltage. The corresponding output signal is thus corrected for any variations in the power supply voltage.

23 Claims, 2 Drawing Sheets

ELECTRONIC SIGNAL GENERATOR WITH MODULATED CYCLIC RATIO, COMPENSATED FOR VARIATIONS IN ITS POWER SUPPLY VOLTAGE

PRIORITY CLAIM

This application claims priority from French Application for Patent No. 06 02189 filed Mar. 13, 2006, the disclosure of which is hereby incorporated by reference.

BACKGROUND OF THE INVENTION

1. Technical Field of the Invention

The present invention relates to techniques for control of class D amplifiers in general.

More specifically, in an embodiment, an electronic generator is presented which is capable of supplying at least a first output signal with a cyclic ratio modulated at a base frequency and particularly adapted to supplying power to an audio transducer, this generator comprising at least a first formatting circuit with one input receiving a first input signal, and one output producing a first intermediate signal with a cyclic ratio modulated at the base frequency; and at least a first class D amplifier powered with a power supply voltage connected to the output from the first formatting circuit, and outputting a signal as the first generator output signal varying as a function of the first intermediate signal and with an amplitude that varies with the power supply voltage, said first formatting circuit comprising at least one integrator generating an integration signal and a comparator generating the first intermediate signal by comparison of the integration signal with a reference signal.

2. Description of Related Art

A signal with a cyclic ratio modulated at a base frequency is a signal for which the amplitude at each instant is equal to only one of two different logical levels, namely a high level or a low level, the value transported by this signal being coded in the "cyclic ratio" that denotes the fraction of each base frequency period during which the signal is at the high level.

Signal generators with cyclic ratio modulation are well known in prior art and are used particularly for controlling receiver loud speakers in mobile telephony.

In this and in other applications, it is generally desirable to maximize the energy of the output signal produced by the generator and to optimize the range of this signal.

However, although the information transported in a signal with modulated cyclic ratio is exclusively and ideally coded in this cyclic ratio, the energy transported by this signal also depends on the amplitude of this signal, in other words the difference between the high level and low level of the signal.

Thus, if the power supply voltage of the class D amplifier is output by a battery, variations in the power available from the battery can cause a variation of the amplitude of the output signal and therefore significantly reduce the performance of the load driven by the generator, for example the loud speaker.

In this context, there is a need in the art for a signal generator with modulated cyclic ratio to overcome this defect.

SUMMARY OF THE INVENTION

To address the foregoing and other needs, a generator comprises an integrator designed to integrate the difference between two composite signals. One of the composite signals is composed of first input and output signals weighted by corresponding amplification factors for which the ratio corresponds to a first gain. The other composite signal is composed of a first offset voltage equal to half of the maximum amplitude of the first input signal, and a second offset voltage equal to half of the power supply voltage, these offset voltages being weighted by corresponding amplification factors with a ratio corresponding to the first gain. The average value of the reference signal output to the comparator is equal to half of the power supply voltage.

The output power can be increased without needing to increase the power supply voltage by designing this generator so that it can also provide a second output signal with a cyclic ratio modulated at the base frequency and particularly adapted to supply power to the audio transducer that also receives the first output signal. This is accomplished by providing this generator with a second formatting circuit with an input receiving a second input signal, and an output producing a second intermediate signal with a cyclic ratio modulated at the base frequency; and a second class D amplifier powered by the power supply voltage connected to the output from the second formatting signal and outputting a signal varying as a function of the second intermediate signal with an amplitude related to the power supply voltage as the second generator output signal. It is preferred that the structure and function of said second formatting circuit are equivalent to the structure and function of the first formatting circuit, the second formatting circuit using said reference signal and said weighted offset voltages to present an amplification ratio corresponding to said first gain, and applying a transfer function identical to the transfer function that the first formatting circuit applies to the first input signal so as to obtain the first intermediate signal, to the second input signal to obtain the second intermediate signal. It is also preferred that the first and second amplifiers form corresponding symmetric halves of a single class D amplification bridge set up in H format, and that the sum of the first and second input signals is equal to a constant average value.

Regardless of its chosen embodiment, this generator can operate by accepting a sinusoidal signal as the first input signal with an average value equal to half of the power supply voltage, in which case the reference signal is then composed of a single pole triangular signal.

Nevertheless, this generator can also operate by accepting a signal as its first input signal with a calibrated amplitude and a cyclic ratio modulated at the base frequency, in which case the reference signal is then composed of a DC signal equal to half of the power supply voltage.

In the latter case, and when the generator produces two output signals, it is advantageous to assure that the second input signal has the same calibrated amplitude as the first input signal, a cyclic ratio modulated at the base frequency and the one's complement to the cyclic ratio of the first input signal, and a 180 degree phase difference from the first input signal, with the result that the first and second output signals are offset by 180 degrees, they have the same amplitude related to the power supply voltage, and corresponding cyclic ratios modulated at the base frequency and the one's complements of each other, the cyclic ratio of each output signal being equal to the cyclic ratio of the corresponding input signal corrected for any variation in the ratio between the amplitude of the power supply voltage and the amplitude of the calibrated voltage.

In an embodiment, an electronic generator supplying at least a first generator output signal with a cyclic ratio modulated at a base frequency to supply power to an audio transducer comprises: at least a first formatting circuit with one input receiving a first input signal and a second input signal, and one output producing a first intermediate signal with a cyclic ratio modulated at the base frequency; and at least a first class D amplifier powered with a power supply voltage connected to the output from the first formatting circuit, and outputting a signal as the first generator output signal varying as a function of the first intermediate signal and with an amplitude that varies with the power supply voltage, the first generator output signal being fed back as the second input signal. The first formatting circuit comprises at least one integrator generating an integration signal in response to a difference between a weighted combination of the first and second input signals and a reference signal which comprises a weighted combination of a first offset voltage and a second offset voltage, and a comparator generating the first intermediate signal by comparison of the integration signal with a reference signal. The first offset voltage is preferably one-half a maximum amplitude of the first signal, and the second offset voltage is preferably one-half a supply voltage applied to the amplifier.

In an embodiment, an electronic generator circuit comprises: a first differential integrator which integrates a difference between a weighted combination of a first input signal and a first feedback signal in comparison to a reference signal; a first comparator which compares an output of the first differential integrator and a reference voltage; and a first class D amplifier receiving an output of the first comparator and generating a first output signal, wherein the second output signal is the first feedback signal.

DETAILED DESCRIPTION OF THE DRAWINGS

An electronic generator as described herein is capable of providing one or two output signals such as Vs1 and Vs2, each with a cyclic ratio modulated at a base frequency 1/T, this generator being adapted particularly to supplying power to an HP audio transducer.

This generator comprises at least one or two formatting circuits such as F1 and F2, and one or two class D amplifiers such as A1 and A2.

Since symmetric duplication of an electronic diagram is a technique well known to those skilled in the art, the generator will be described with reference to the figures in its most complete version, however it being understood that it could be made without using the formatting circuit F2 nor the amplifier A2.

Each of the formatting circuits F1 and F2 has a corresponding input 10 or 20 receiving an input signal Ve1 or Ve2.

Although the generator is not restricted to this application, as will be described later, for the moment it will be assumed that the input signals are of the type illustrated in FIG. 3.

Therefore, it will be assumed that the input signal Ve1 is composed of a signal with a cyclic ratio modulated at the base frequency 1/T and a calibrated amplitude E, the frequency 1/T for example being of the order of 400 kHz.

It will be assumed that the input signal Ve2 is composed of a signal with the same calibrated amplitude E as the input signal Ve1, a cyclic ratio modulated at the base frequency 1/T and the one's complement of the cyclic ratio of the input signal Ve1, and has a phase difference of 180 degrees from the first input signal Ve1.

Under these conditions, the input signals Ve1 and Ve2 are such that the average value of their sum is constant.

Each of the formatting circuits F1 and F2 also has a corresponding output 11 or 21 on which it outputs a corresponding intermediate signal Vi1 or Vi2 with a cyclic ratio modulated at the base frequency 1/T.

Figure 2:
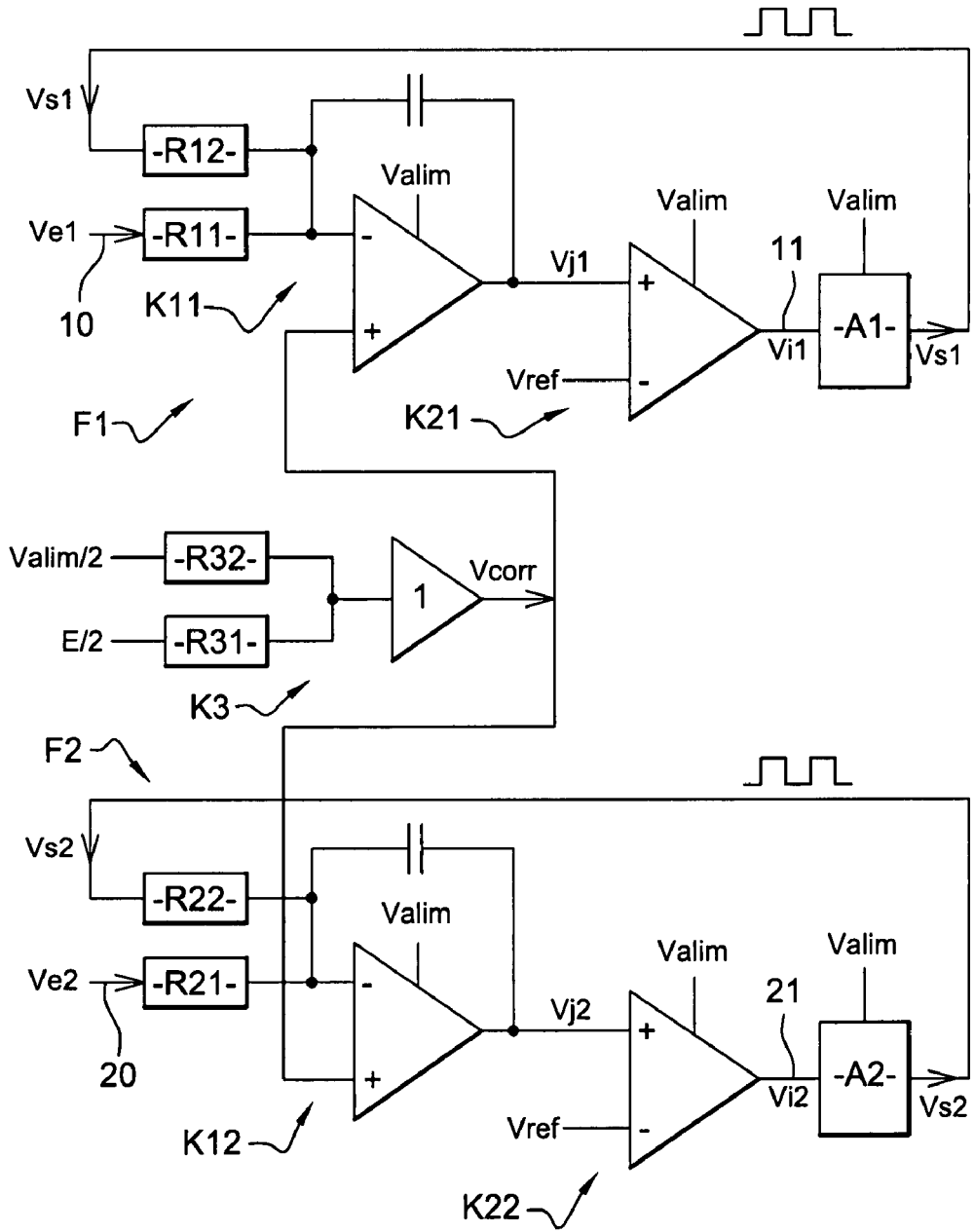
FIG. 2 is another general diagram showing a generator outputting two output signals, this diagram representing the two formatting circuits in detail.

As shown in FIG. 2, the formatting circuit F1 comprises firstly an integrator K11 capable of producing an integration signal Vj1, and secondly a comparator K21 connected to the integrator K11 and capable of producing the intermediate signal Vi1 by comparing the integration signal Vj1 with a reference signal Vref.

Similarly, the formatting circuit F2 comprises firstly an integrator K12 capable of generating an integration signal Vj2, and secondly a comparator K22 connected to the integrator K12 and capable of producing the intermediate signal Ki2 by comparing the integration signal Vj2 with a reference signal Vref.

The class D amplifier A1 is powered by a power supply voltage Valim and is connected to the output 11 from the formatting circuit F1, and supplies a signal to the HP transducer as the first output signal Vs1 from the generator, varying as a function of the intermediate signal Vi1 and with an amplitude related to the power supply voltage Valim.

Similarly, the class D amplifier A2 is powered by the power supply voltage Valim, is connected to the output 21 from the formatting circuit F2 and supplies a signal varying as a function of the intermediate signal Vi2 and with an amplitude related to the power supply voltage Valim, to the HP transducer as the second output signal Vs2 from the generator.

Figure 1:
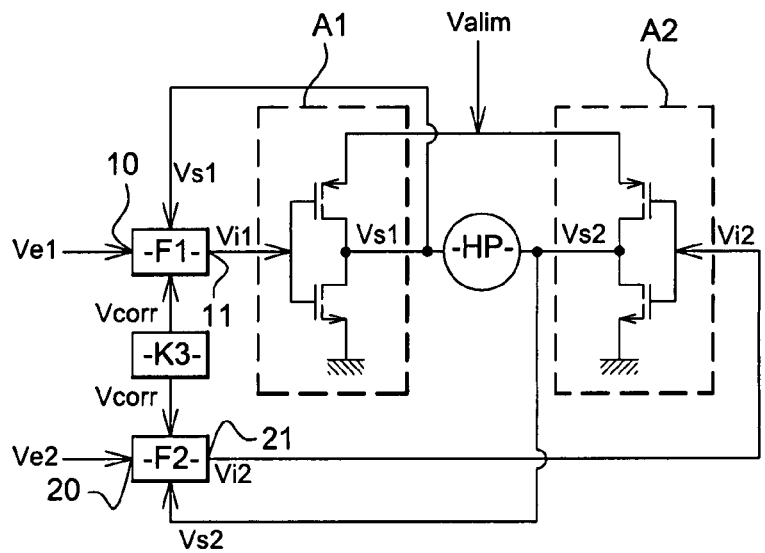
FIG. 1 is a general diagram showing a generator which outputs two output signals, this diagram showing details of the two class D amplifiers.

As can be seen in FIG. 1, the amplifiers A1 and A2 provide corresponding symmetric halves of a single class D amplification bridge set up in H format.

As is also shown in FIG. 1, each of the amplifiers A1 and A2 is formed from two MOSFET transistors with opposite channel types operating as switches, the gates of these transistors being connected to the output from the corresponding formatting circuit, and their sources being connected to the HP transducer.

According to the invention, the integration signals Vj1 and Vj2 are generated from the corresponding input signals Ve1 and Ve2, and corresponding output signals Vs1 and Vs2 applied in counter-reaction.

More precisely, the integrator K11 of the circuit F1 is designed to integrate the difference between two composite signals, the first of which is composed of the input signal Ve1 and the output signal Vs1 weighted by the input resistances R12 and R11 forming corresponding amplification factors.

The second composite signal Vcorr is generated by a circuit K3 formed from a follower amplifier, the input of this amplifier receiving offset voltages E/2 equal to half the maximum amplitude E of the input signals Ve1 and Ve2, and Valim/2 equal to half of the power supply voltage Valim, these offset voltages being weighted by input resistances R32 and R31 forming corresponding amplification factors.

Similarly, the integrator K12 of the circuit F2 is designed to integrate the difference between two composite signals, the first of which is composed of the input signal Ve2 and the output signal Vs2 weighted by the input resistances R22 and R21 forming corresponding amplification factors, and the second of which is composed of the composite signal Vcorr.

Finally, the average value of the reference signal Vref supplied to each of the comparators K21 and K22 is equal to half of the power supply voltage Valim, in other words Valim/2.

Figure 3:
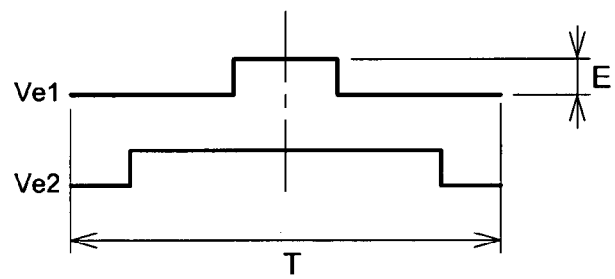
FIG. 3 is a diagram representing two input signals that can be processed by the generator illustrated in FIGS. 1 and 2.

In the case considered in which the input signals Ve1 and Ve2 are signals with a modulated cyclic ratio as illustrated in FIG. 3, the reference signal Vref output to each of the comparators K21 and K2 is equal to half of the power supply voltage Valim, in other words Valim/2.

The resistances R11, R12, R21 and R22 are chosen such that the formatting circuits F1 and F2 have the same gain G in closed loop, and are therefore such that:

$$R12/R11 = R22/R21 = G,$$

the gain G being chosen to be equal to at least 2 to assure that these circuits are stable.

The signals Vcorr, Vs1 and Vs2 themselves satisfy the following relations:

$$Vcorr = (R31 * Valim + R32 * E)/2*(R31 + R32);$$

$$Vs1 = Valim*(R31/R11)*(R11 + R12)/2*(R31 + R32) + (E/2)*(((R32/R11)*(R11/R12)/(R31 + R32)) - (R12/R11));$$

$$Vs2 = Valim*(R31/R21)*(R21 + R22)/2*(R31 + R32) + (E/2)*(((R32/R21)*(R21/R22)/(R31 + R32)) - (R22/R21))$$

Thus, if $R31/R11 = R32/R12 = R31/R21 = R32/R22 = k$, where k is a const non-zero factor, then:

$$Vcorr = (Valim + G*E)/2**(G+1);$$

$$Vs1 = Valim/2,$$

$$Vs2 = Valim/2.$$

In practice, the factor k may for example be advantageously chosen to be equal to 1.

Under these conditions, the output signals Vs1 and Vs2 that in practice have an amplitude equal to Valim, have a cyclic ratio equal to 0.5 when the input signals Ve1 and Ve2 themselves have a cyclic ratio equal to 0.5, and the operating point of the comparators K21 and K22 varies around Valim/2.

Therefore in summary, the structure and function of the formatting circuit F2 are equivalent to the structure and function of the formatting circuit F1, the formatting circuit F2 uses the reference signal Vref and offset voltages E/2 and Valim/2 weighted to have an amplification ratio R21/R31 equal to the gain G defined by R12/R11, and applies a transfer function identical to the transfer function applied by the first formatting circuit F1 to the first input signal Ve1 to obtain the first intermediate signal Vi1, to the second input signal Ve2 to obtain the second intermediate signal Vi2.

When the cyclic ratio of the input signal Ve1 is equal to D0 and the power supply voltage is equal to Valim1, the cyclic ratio D11 of the output signal Vs1 is equal to:

$$D11 = 0.5*(1 + E/\text{Valim1}*G*(2*D0-1)).$$

Similarly, when the cyclic ratio of the input signal Ve1 is equal to D0 and the power supply voltage is equal to Valim2, the cyclic ratio D12 of the output signal Vs1 is equal to:

$$D12 = 0.5*(1 + E/\text{Valim2}*G*(2*D0-1).$$

The result is:

$$\text{Valim1}/\text{Valim2} = (2*D12-1)/(2*D1-1).$$

In other words, the output signals Vs1 and Vs2, which are assumed to be signals offset with each other by 180 degrees, with the same amplitude in practice equal to the power supply voltage Valim, and cyclic ratios modulated at the base frequency 1/T and the one's complement of each other, are also such that the cyclic ratio of each of these output signals Vs1 and Vs2 is equal to the cyclic ratio of the corresponding input signal Ve1 or Ve2, corrected by any variation in the ratio Valim/E between the amplitude of the power supply voltage Valim and the amplitude of the calibrated voltage E.

This property is illustrated in FIGS. 4A to 4J, the first two of which illustrate the input signals Ve1 and Ve2.

Figure 4:
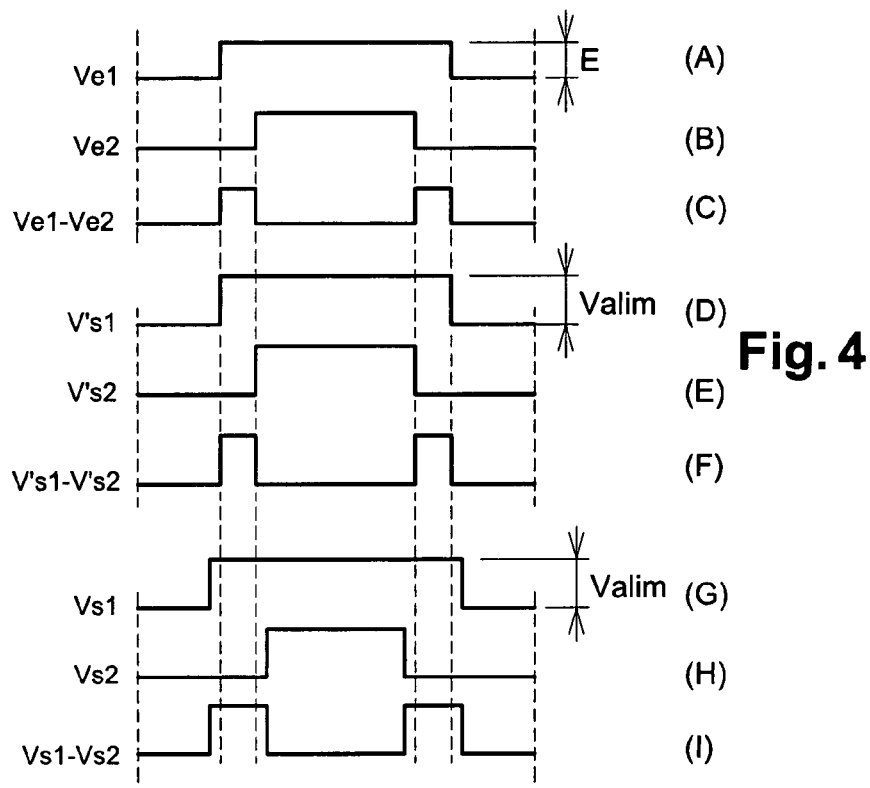
FIGS. 4A to 4I are diagrams representing various signals illustrating operation of the generator shown in FIGS. 1 and 2.

FIG. 4C represents the difference Ve1-Ve2 between these signals, in other words the differential signal that transports information about the energy to be supplied to the HP transducer.

FIGS. 4D and 4E represent the virtual output signals Vs1' and Vs2' that would be produced by the amplifiers A1 and A2 starting from the input signals Ve1 and Ve2, assuming that the formatting circuits F1 and F2 operate in open loop.

FIG. 4F that represents the difference in these virtual output signals, confirms that the cyclic ratios of the signals Vs1' and Vs2' are then identical to the corresponding cyclic ratios of the signals Ve1 and Ve2, regardless of variations in the power supply voltage Valim.

FIGS. 4G and 4H show output signals Vs1 and Vs2 actually produced from the input signals Ve1 and Ve2 by the amplifiers A1 and A2 as driven by the formatting circuits F1 and F2 operating in closed loop, the power supply voltage Valim assumed to be below its nominal reference value.

Under these conditions, and as shown in FIG. 4T that represents the difference between the real output signals Vs1 and Vs2, the cyclic ratios of these signals Vs1 and Vs2 are different from the cyclic ratios of the input signals Ve1 and Ve2, such that they are corrected for the amount by which the power supply voltage is low, such that the HP transducer receives a quantity of energy that depends only on the cyclic ratios of the input signals Ve1 and Ve2 and a fixed amplification factor.

As mentioned above, the generator according to the invention can process input signals other than the signals illustrated in FIG. 3.

Thus, the first input signal Ve1 may be composed of a sinusoidal signal with an average value equal to half of the power supply voltage Valim, in other words a sinusoidal signal superposed on a DC component equal to Valim/2.

In this case, the reference signal Vref is composed of a single-pole triangular signal that is also superposed on a DC component equal to Valim/2.

If the generator used comprises two formatting circuits and two amplifiers, and therefore accepts a second input signal Ve2, this second input signal is also composed of a sinusoidal signal with the same maximum amplitude as the first input signal Ve1, superposed on a DC component equal to Valim/2, and offset with the first input signal Ve1 by 180 degrees.

For audio applications, the frequency of the sinusoidal input signal is typically between 20 Hz and 20 kHz, in theory the triangular reference signal having a frequency equal to at least twice the frequency of the sinusoidal input signal, and in practice a frequency for example of the order of 400 kHz.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An electronic generator supplying at least one first output signal with a cyclic ratio modulated at a base frequency to supply power to an audio transducer, comprising:

at least a first formatting circuit with one input receiving a first input signal, and one output producing a first intermediate signal with a cyclic ratio modulated at the base frequency; and at least a first class D amplifier powered with a power supply voltage connected to the output from the first formatting circuit, and outputting a signal as the first generator output signal varying as a function of the first intermediate signal and with an amplitude that varies with the power supply voltage, said first formatting circuit comprising at least one integrator generating an integration signal and a comparator generating the first intermediate signal by comparison of the integration signal with a reference signal, wherein the integrator integrates the difference between two composite signals, wherein one of the composite signals is composed of first input and output signals weighted by corresponding amplification factors for which the ratio corresponds to a first gain, wherein the other composite signal is composed of a first offset voltage equal to half of the maximum amplitude of the first input signal, and a second offset voltage equal to half of the power supply voltage, these offset voltages being weighted by corresponding amplification factors with a ratio corresponding to the first gain, and wherein the average value of the reference signal output to the comparator is equal to half of the power supply voltage.

2. The electronic generator set forth in claim 1, wherein the first input signal is a sinusoidal signal with an average value equal to half of the power supply voltage, and wherein the reference signal is a single pole triangular signal.

3. The electronic generator set forth in claim 1, wherein the first input signal is a signal with a calibrated amplitude and a cyclic ratio modulated at the base frequency, and wherein the reference signal is equal to half the power supply voltage.

4. The electronic generator set forth in claim 1, which further supplies a second output signal with a cyclic ratio modulated at the base frequency to supply power to the audio transducer, which also receives the first output signal, and further comprising:

a second formatting circuit with an input receiving a second input signal, and an output outputting a second intermediate signal with a cyclic ratio modulated at the base frequency; and a second class D amplifier supplied by power supply voltage, connected to the output from the second formatting circuit, and supplying a signal as the second output signal from the generator, varying as a function of the second intermediate signal and with an amplitude related to the power supply voltage, wherein the structure and function of said second formatting circuit are equivalent to the structure and function of the first formatting circuit, the second formatting circuit (F2) using said reference signal and said weighted offset voltages to present an amplification ratio corresponding to said first gain, and applying a transfer function identical to the transfer function that the first formatting circuit applies to the first input signal so as to obtain the first intermediate signal, to the second input signal to obtain the second intermediate signal, and wherein the first and second amplifiers form corresponding symmetric halves of a single class D amplification bridge set up in H format, and wherein the sum of the first and second input signals is equal to a constant average value.

5. The electronic generator set forth in claim 4, wherein the second input signal is a signal with the same calibrated amplitude as the first input signal, a cyclic ratio modulated at the base frequency and the one's complement to the cyclic ratio of the first input signal, and a 180 degree phase difference from the first input signal, with the result that the first and second output signals are offset by 180 degrees, they have the same amplitude related to the power supply voltage, and corresponding cyclic ratios modulated at the base frequency and the one's complements of each other, the cyclic ratio of each output signal being equal to the cyclic ratio of the corresponding input signal corrected for any variation in the ratio between the amplitude of the power supply voltage and the amplitude of the calibrated voltage.

6. An electronic generator supplying at least a first generator output signal with a cyclic ratio modulated at a base frequency to supply power to an audio transducer, comprising:

at least a first formatting circuit with one input receiving a first input signal and a second input signal, and one output producing a first intermediate signal with a cyclic ratio modulated at the base frequency; and at least a first class D amplifier powered with a power supply voltage connected to the output from the first formatting circuit, and outputting a signal as the first generator output signal varying as a function of the first intermediate signal and with an amplitude that varies with the power supply voltage, the first generator output signal being fed back as the second input signal, said first formatting circuit comprising at least one integrator generating an integration signal in response to a difference between a weighted combination of the first and second input signals and a reference signal which comprises a weighted combination of a first offset voltage and a second offset voltage, and a comparator generating the first intermediate signal by comparison of the integration signal with a reference signal, wherein the first offset voltage is one-half a maximum amplitude of the first signal, and wherein the second offset voltage is one-half a supply voltage applied to the amplifier.

7. An electronic generator circuit, comprising:

a reference circuit that generates a reference signal that is a weighted combination of a first offset voltage and a second offset voltage;

a first differential integrator which integrates a difference between a weighted combination of a first input signal and a first feedback signal in comparison to the reference signal;

a first comparator which compares an output of the first differential integrator and a reference voltage; and a first class D amplifier receiving an output of the first comparator and generating a first output signal, wherein the first output signal is the first feedback signal.

8. The circuit of claim 7 wherein the first input signal is a signal with a cyclic ratio modulated at a base frequency and having a calibrated amplitude.

9. The circuit of 8 wherein the reference circuit comprises a follower amplifier generating the reference signal for the first differential integrator, the first offset voltage being equal to one-half the calibrated amplitude and the second offset voltage being equal to one-half a power supply voltage applied to the first class D amplifier.

10. The circuit of claim 9 wherein reference voltage for the first comparator is equal to one-half the power supply voltage applied to the first class D amplifier.

11. The circuit of claim 7, further comprising:
a second differential integrator which integrates a difference between a weighted combination of a second input signal and a second feedback signal in comparison to the reference signal;
a second comparator which compares an output of the second differential integrator and the reference voltage;
a second class D amplifier receiving an output of the second comparator and generating a second output signal, wherein the second output signal is the second feedback signal.

12. The circuit of claim 11 wherein the first and second input signals each are a signal with a cyclic ratio modulated at a base frequency and having a calibrated amplitude.

13. The circuit of 12 further comprising a follower amplifier generating the reference signal for the first and second differential integrators in response to a weighted combination of a first offset voltage equal to one-half the calibrated amplitude and a second offset voltage equal to one-half a power supply voltage applied to the first and second class D amplifiers.

14. The circuit of claim 13 wherein reference voltage for the first and second comparators is equal to one-half the power supply voltage applied to the first class D amplifier.

15. The circuit of claim 11 further comprising an audio transducer including a first and a second terminal, wherein the first output signal is applied to the first terminal of the audio transducer and the second output signal is applied to the second terminal of the audio transducer.

16. The circuit of claim 7 further comprising an audio transducer including a first terminal, wherein the first output signal is applied to the first terminal of the audio transducer.

17. An electronic generator circuit, comprising:
a first differential integrator which integrates a difference between a weighted combination of a first input signal and a first feedback signal in comparison to a reference signal, wherein the first input signal is a signal with a cyclic ratio modulated at a base frequency and having a calibrated amplitude;
a first comparator which compares an output of the first differential integrator and a reference voltage;
a first class D amplifier receiving an output of the first comparator and generating a first output signal, wherein the first output signal is the first feedback signal; and
a follower amplifier generating the reference signal for the first differential integrator in response to a weighted combination of a first offset voltage equal to one-half the calibrated amplitude and a second offset voltage equal to one-half a power supply voltage applied to the first class D amplifier.

18. The circuit of claim 17 wherein reference voltage for the first comparator is equal to one-half the power supply voltage applied to the first class D amplifier.

19. An electronic generator circuit, comprising:
a first differential integrator which integrates a difference between a weighted combination of a first input signal and a first feedback signal in comparison to a reference signal;
a first comparator which compares an output of the first differential integrator and a reference voltage;
a first class D amplifier receiving an output of the first comparator and generating a first output signal, wherein the first output signal is the first feedback signal;
a second differential integrator which integrates a difference between a weighted combination of a second input signal and a second feedback signal in comparison to the reference signal;
a second comparator which compares an output of the second differential integrator and the reference voltage; and
a second class D amplifier receiving an output of the second comparator and generating a second output signal, wherein the second output signal is the second feedback signal.

20. The circuit of claim 19 wherein the first and second input signals each are a signal with a cyclic ratio modulated at a base frequency and having a calibrated amplitude.

21. The circuit of claim 20 further comprising a follower amplifier generating the reference signal for the first and second differential integrators in response to a weighted combination of a first offset voltage equal to one-half the calibrated amplitude and a second offset voltage equal to one-half a power supply voltage applied to the first and second class D amplifiers.

22. The circuit of claim 21 wherein reference voltage for the first and second comparators is equal to one-half the power supply voltage applied to the first class D amplifier.

23. The circuit of claim 19 further comprising an audio transducer including a first and a second terminal, wherein the first output signal is applied to the first terminal of the audio transducer and the second output signal is applied to the second terminal of the audio transducer.

* * * * *